(12) United States Patent
Wysocki et al.

(10) Patent No.: US 7,869,474 B2
(45) Date of Patent: Jan. 11, 2011

(54) FAST WAVELENGTH TUNING TECHNIQUES FOR EXTERNAL CAVITY LASERS

(75) Inventors: Gerard Wysocki, Princeton, NJ (US); Frank K. Tittel, Houston, TX (US)

(73) Assignee: William Marsh Rice University, Houston, TX (US)

( * ) Notice: Subject to any disclaimer, the term of this patent is extended or adjusted under 35 U.S.C. 154(b) by 211 days.

(21) Appl. No.: 12/349,839

(22) Filed: Jan. 7, 2009

(65) Prior Publication Data

US 2010/0067554 A1 Mar. 18, 2010

Related U.S. Application Data

(60) Provisional application No. 61/020,334, filed on Jan. 10, 2008.

(51) Int. Cl.
*H01S 3/139* (2006.01)
*H01S 3/086* (2006.01)
(52) U.S. Cl. .................. 372/29.022; 372/102; 372/107; 372/93
(58) Field of Classification Search ............ 372/29.022, 372/93, 102, 107
See application file for complete search history.

(56) References Cited

U.S. PATENT DOCUMENTS

| 6,560,259 B1 | 5/2003 | Hwang |
| 6,690,690 B2 | 2/2004 | Marron |
| 6,704,332 B2 | 3/2004 | Chapman et al. |
| 7,388,890 B2 | 6/2008 | Le et al. |
| 2005/0105566 A1 | 5/2005 | Sacher |
| 2007/0047599 A1 | 3/2007 | Wysocki et al. |

OTHER PUBLICATIONS

Advisory Action dated May 8, 2008 (3 pages), U.S. Appl. No. 11/203,785, filed Aug. 15, 2005.
Advisory Action dated Apr. 24, 2009 (3 pages), U.S. Appl. No. 11/203,785, filed Aug. 15, 2005.
Maulini, Richard, et al., "Continuous-wave operation of a broadly tunable thermoelectrically cooled external cavity quantum-cascade laser," Optics Letters, Oct. 1, 2005, pp. 2584-2586, vol. 30, No. 19, Optical Society of America.

(Continued)

*Primary Examiner*—Minsun Harvey
*Assistant Examiner*—Marcia A. Golub-Miller
(74) *Attorney, Agent, or Firm*—Conley Rose, P.C.; Rodney B. Carroll (57) ABSTRACT

An apparatus comprising a laser source configured to emit a light beam along a first path, an optical beam steering component configured to steer the light beam from the first path to a second path at an angle to the first path, and a diffraction grating configured to reflect back at least a portion of the light beam along the second path, wherein the angle determines an external cavity length. Included is an apparatus comprising a laser source configured to emit a light beam along a first path, a beam steering component configured to redirect the light beam to a second path at an angle to the first path, wherein the optical beam steering component is configured to change the angle at a rate of at least about one Kilohertz, and a diffraction grating configured to reflect back at least a portion of the light beam along the second path.

16 Claims, 3 Drawing Sheets

OTHER PUBLICATIONS

Namjou, K., et al., "Sensitive absorption spectroscopy with a room-temperature distributed-feedback quantum-cascade laser," Optics Letters, Feb. 1, 1998, pp. 219-221, vol. 23, No. 3, Optical Society of America.

Office Action dated May 1, 2007 (6 pages), U.S. Appl. No. 11/203,785, filed Aug. 15, 2005.

Office Action (Final) dated Feb. 22, 2008 (12 pages), U.S. Appl. No. 11/203,785, filed Aug. 15, 2005.

Office Action dated Sep. 17, 2008 (9 pages), U.S. Appl. No. 11/203,785, filed Aug. 15, 2005.

Office Action (Final) dated Feb. 20, 2009 (10 pages), U.S. Appl. No. 11/203,785, filed Aug. 15, 2005.

Office Action dated Jun. 26, 2009 (12 pages), U.S. Appl. No. 11/203,785, filed Aug. 15, 2005.

Provisional patent application entitled "Fast wavelength tuning technique for external cavity lasers," by Gerard Wysocki, et al., filed Jan. 10, 2008 as U.S. Appl. No. 61/020,334.

Wysocki, G., et al., "Widely tunable mode-hop free external cavity quantum cascade laser for high resolution spectroscopic applications," Applied Physics B—Lasers and Optics, 2005, pp. 769-777, vol. 81, Springer-Verlag.

FAST WAVELENGTH TUNING TECHNIQUES FOR EXTERNAL CAVITY LASERS

CROSS-REFERENCE TO RELATED APPLICATIONS

The present application claims priority to U.S. Provisional Patent Application 61/020,334 filed Jan. 10, 2008 by Gerard Wysocki et al. and entitled "Fast Wavelength Tuning Technique for External Cavity Lasers," which is incorporated herein by reference as if reproduced in its entirety.

STATEMENT REGARDING FEDERALLY SPONSORED RESEARCH OR DEVELOPMENT

This invention was made with U.S. Government support under Contract No.: DE-FG02-06ER86264 awarded by the Department of Energy through pass-through funding to Aerodyne Research Inc. The Government has certain rights in this invention.

REFERENCE TO A MICROFICHE APPENDIX

Not applicable.

BACKGROUND

Infrared laser absorption spectroscopy is an effective tool for detecting trace gases. However, the usefulness of laser spectroscopy is limited by the lack of broadly tunable mode-hop-free sources, for example in the mid-infrared (IR) region, which may be defined as wavelengths between about three and about 30 micrometers ($\mu m$). A mode-hop-free source may be defined as a source that exhibits laser emissions over a continuous range of wavelengths or frequencies without abrupt changes in the laser output power or phase.

Quantum Cascade (QC) and Interband Cascade (IC) lasers are suitable light sources for spectroscopic applications. The high power of QC and IC lasers permits the use of advanced detection techniques that improve the Signal-to-Noise (S/N) ratio of trace gas spectra measurements and decrease the apparatus size. In addition, the large wavelength coverage available with QC and IC lasers allows monitoring numerous molecular trace gas species.

Spectroscopic applications require single mode operation, which can be achieved by introducing a distributed feedback (DFB) structure into the QC Laser (QCL) active region. Experiments using distributed feedback lasers have demonstrated the efficacy of these devices for sensitive and highly selective real time trace gas concentration measurements based on absorption spectroscopy, with sensitivities of several parts per billion. An example of such studies is presented by K. Namjou et al. in Optics Letters, V. 23, n. 3, published Feb. 1, 1998 and entitled "Sensitive absorption spectroscopy with a room-temperature distributed-feedback quantum-cascade laser," which is incorporated herein by reference as if reproduced in its entirety.

Although DFB QCLs show high performance and reliability, they are useful only over narrow wavelength ranges. This is because the range of wavelength tuning of the emitted laser radiation is limited by the tuning range of the DFB structures. Typically, the maximum tuning range of DFB QCLs is of about ten inverse centimeters ($cm^{-1}$), which is achieved by varying either the temperature of the gain chip or cavity or the laser injection current. One of the disadvantages of thermal tuning is that it changes the effective gain of the QCL, which causes the output laser power to decrease with increasing temperature of the QCL chip.

To take full advantage of the wavelength tunability potential of a QCL, an external cavity (EC) configuration can be applied. However, high quality or effective anti-reflective (AR) coatings, e.g., that have low reflection, low absorption, and high transmission at a continuous range of wavelengths, are necessary for mode-hop-free EC laser operations and are not generally available for the mid-IR spectrum. The lack of effective AR coatings in the mid-IR range makes it difficult to achieve laser wavelength tuning without experiencing mode-hopping, e.g., without discontinuities or gaps in the wavelength or frequency range of the laser output. A laser that exhibits mode-hopping is not useful in high resolution spectroscopic applications, such as spectral measurements of rotational-vibrational molecular transitions, where information is needed over a continuous wavelength range of measurements.

SUMMARY

In one embodiment, the disclosure includes an apparatus comprising a laser source configured to emit a light beam along a first path, an optical beam steering component configured to steer the light beam from the first path to a second path at an angle to the first path, and a diffraction grating configured to reflect back at least a portion of the light beam along the second path, wherein the angle determines an external cavity length.

In another embodiment, the disclosure includes an apparatus comprising a laser source configured to emit a light beam along a first path, a beam steering component configured to redirect the light beam to a second path at an angle to the first path, wherein the optical beam steering component is configured to change the angle at a rate of at least about one Kilohertz, and a diffraction grating configured to reflect back at least a portion of the light beam along the second path.

In yet another embodiment, the disclosure includes an apparatus comprising a laser source configured to emit a light beam along a first path, an optical beam steering component configured to steer the light beam from the first path to a second path at an angle to the first path, and a diffraction grating configured to reflect back at least a portion of the light beam along the second path, wherein none of the laser source, the optical beam steering component, and the diffraction grating are linearly translated to vary an external cavity length.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

In some cases, mode-hopping may be avoided by varying the EC length of a QCL while rotating a diffraction grating coupled to the QCL around a pivot point. Rotating the diffraction grating changes the incident angle of the QCL light beam with respect to a normal axis on the surface of the diffraction grating. Changing the incident angle of the QCL light beam changes the wavelength of a reflected portion of the light beam, which may be coupled to an output of the QCL. This approach may work when an effective AR coating is available, such as in the visible and near-IR spectral regions, but is not suitable in the absence of an effective AR coating, such as in the mid-IR range.

Disclosed herein are systems and apparatus for fast tunable and mode-hop-free EC Lasers (ECLs). The fast tunable mode-hop-free ECLs may have light emission at a continuous range of wavelengths, including mid-IR wavelengths, based on the particular laser's design. The fast tunable mode-hop-free ECLs may comprise a laser source, which may be a semiconductor laser, such as a QCL or an IC laser. The laser source may not comprise an AR coating or may comprise a low reflectance coating. Additionally, the fast tunable mode-hop-free ECLs may comprise at least one optical beam steering component, such as a mirror coupled to a high speed rotary stage, and a diffraction grating. The laser source, the optical beam steering component, and the diffraction grating may be arranged in a Littrow configuration, where a portion of the light beam propagating along a plurality of paths from the laser source to the diffraction grating may be reflected back along the same paths.

The optical beam steering component may redirect the light beam from a first path between the optical beam steering component and the laser source to a second path between the optical beam steering component and the diffraction grating. "Fast tuning" may be defined as tuning at a rate of at least about one kilohertz (kHz). As such, the optical beam steering component may be controlled to steer the light beam or change the light beam's angle between the first path and the second path at a predetermined rate, such as at least about one kHz, at least about three kHz, or at least about five kHz. As a result, the light beam's incident angle on the surface of the diffraction grating may be varied at about a matching rate. Additionally, changing the light beam's angle between the first path and the second path may change the length of the second path, and hence an effective EC length of the mode-hop-free ECL. As such, the incident angle and the EC length may be changed simultaneously to achieve wavelength tuning at a rate corresponding to the light beam steering rate without substantial mode-hopping, e.g., without discontinuities in the wavelength or frequency of the reflected portion of the light beam at the output. Changing the incident angle and the EC length may also promote laser output emissions at about equal power levels.

In some embodiments, the diffraction grating may be rotated at substantially slower rates or at about the same rate as the optical beam steering component to extend the mode-hop-free wavelength tuning range. In some embodiments, the fast tunable mode-hop-free ECLs may comprise a plurality of optical beam steering components, which may be controlled to steer the light beam at high speeds to improve the design flexibility and the wavelength tunability. In some embodiments, an optical beam steering device, such as an electro-optical prism, may be used to change the light beam's angle between different paths.

Figure 1:
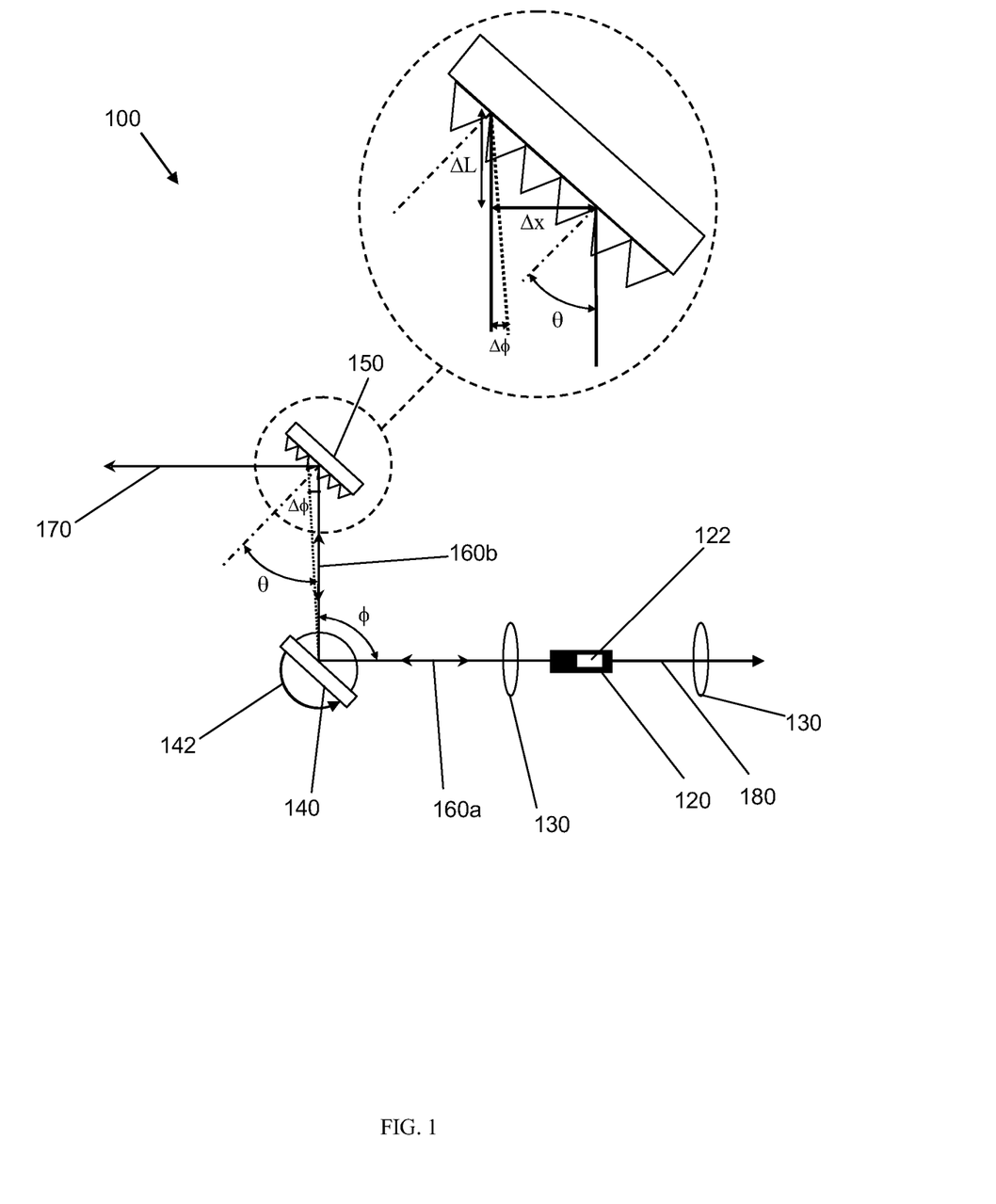
FIG. 1 is a schematic diagram of an embodiment of a fast tunable mode-hop-free ECL.

FIG. 1 illustrates one embodiment of a fast tunable mode-hop-free ECL 100, which may comprise a single actuator coupled to an optical beam steering component and a single folded Littrow cavity configuration. A Littrow cavity configuration may be one in which the diffraction grating produces a zeroth order reflection that is directed away from the laser and a non-zeroth, e.g., a first, order reflection that is directed back towards the laser. Tuning is accomplished by changing the angle that the beam hits the grating. The fast tunable mode-hop-free ECL 100 may comprise a laser source 120, which may include a gain medium or gain chip 122 within an intra-cavity of the laser source 120. The fast tunable mode-hop-free ECL 100 may also comprise a plurality of lenses 130, an optical beam steering component mirror 140, and a diffraction grating 150. The laser source 120, the optical beam steering component 140, and the diffraction grating 150 may be arranged in a single folded Littrow cavity configuration. Accordingly, the fast tunable mode-hop-free ECL 100 may comprise a first path 160a between the laser source 120 and the optical beam steering component 140, and a second path 160b between the optical beam steering component 140 and the diffraction grating 150. A light beam may propagate from the laser source 120 along the first path 160a and the second path 160b to the diffraction grating 150, and at least a portion of the reflected light beam may propagate back along the second path 160b and the first path 160a. Additionally, the fast tunable mode-hop-free ECL 100 may comprise an unused path 170 at the diffraction grating and an output path 180 at the laser source 120.

The laser source 120 may be any type of laser suitable for producing a light beam, which may or may not comprise a gain chip 122. For example, the laser source 120 may be a semiconductor laser comprising a gain chip 122 having an optical gain or amplification at a continuous range of tunable wavelengths. The continuous range of tunable wavelengths may be in the mid-to-long-IR wavelength range, e.g., greater than or equal to about three μm. Additionally or alternatively, the continuous range of tunable wavelengths may be in the terahertz wavelengths, e.g., from about 100 μm to about one millimeter (mm), the near-IR to short-IR wavelengths, e.g., from about 0.75 to about 3 μm, the visible wavelengths, e.g., from about 0.4 to about 0.75 μm, the ultra-violet (UV) wavelengths, e.g., less than or equal to about 0.4 μm, or combinations thereof. In an embodiment, the gain chip 122 may be a QCL or IC laser chip that has optical gain wavelengths from about three to about 30 μm, which may be tuned by varying an injection current. In other embodiments, the laser source 120 may be a gas laser or a solid state laser and the gain chip 122 may be tuned via injection current or optical pumping. In some embodiments, the gain chip 122 may be coupled to a thermo-electric cooler to maintain a constant temperature and stable optical amplification at the gain chip 122.

Further, the intra-cavity of the laser source 120 may be configured to promote lasing. For example, the inner walls of the intra-cavity of the laser source 120 may be coated with high reflection coating, such as aluminum oxide ($Al_2O_3$), which may reflect some of the light internally at least at some portion of the continuous range of tunable wavelengths. Accordingly, some of the light may undergo multiple reflections within the intra-cavity, which may promote lasing. For instance, the intra-cavity may be a Fabry-Perot cavity, where multiple reflections of the light within the cavity may increase the optical coherence and amplify the light. The range of tunable wavelengths of the amplified light may correspond to a gain curve, which may be determined by the tunable range of the injection current, the length of the intra-cavity, the high reflection coating of the walls of the intra-cavity, or combinations thereof. The amplified light may have higher power at the wavelengths near the center of the gain curve and lower power at the wavelengths near the edges of the gain curve. In some embodiments, the wavelength tuning range of the laser source 120 may be from about 1% to about 50%, from about 5% to about 20%, or equal to about 10% of the center wavelength of the gain curve.

A portion of the amplified light may be emitted from the laser source 120, which may exit the laser source 120 via either side of the intra-cavity, for instance through an aperture or a transparency within the intra-cavity wall. The laser source 120 may not comprise any AR coatings at the sides of the intra-cavity or may comprise low reflectance coatings, for instance those that reflect less than about 90%, less than about 70%, or less than about 50% of the light. As such, at least some of the light at the wavelengths that could be suppressed by the AR coatings, for instance due to low reflection, may be reflected more efficiently within the intra-cavity and partially transmitted outside the intra-cavity of the laser source 120.

The lenses 130 may be any lenses or other optical elements such as concave minors suitable for focusing or collimating the light beam. For example, one or both of the lenses 130 may be a collimating lens, which may transform the emitted light from the laser source 120 from a diverging light beam into a parallel light beam that may diverge slower as it propagates. In an embodiment, the lens 130 may be a fast aspheric lens, e.g., one that has an f number (f#) less than or equal to about one, with anti-reflection (AR) coating. The fast aspheric lens may be configured to eliminate or reduce spherical aberrations in the light beam. For example, the lens 130 may be a germanium (Ge) lens and have an f# equal to about 0.6 (f/0.6) and an AR coating designed for wavelengths between about three and 12 μm. In some embodiments, the lens 130 between the laser source 120 and the optical beam steering component 140 may be mounted on a three-dimensional translation stage, which may be controlled remotely. For example, the three-dimensional translation stage may be a mechanical actuator, such as a piezo-actuator. As such, the lenses 130 may be aligned with less difficulty with the light beam, the laser source 120, and the optical beam steering component 140, for instance when the components of the fast tunable mode-hop-free ECL 100 are confined within a vacuum-tight housing. Alternatively, the lens 130 between the laser source 120 and the optical beam steering component 140 may be movable independent of the optical beam steering component 140. In other non-vacuum arrangements, one or both of the lenses 130 may be aligned manually. The lenses 130 may be aligned initially after aligning the laser source 120 or both the laser source 120 and the optical beam steering component 140, and no further alignment for the lenses 130 may be necessary.

The optical beam steering component 140 may be configured to steer or redirect the light beam of the laser source 120 from the first path 160a to the second path 160b in a controlled manner. Specifically, the optical beam steering component may be controlled to change an angle, φ, between the first path 160a and the second path 160b, as shown in FIG. 1. The optical beam steering component 140 may be initially aligned with respect to the laser source 120 to redirect the light beam at an initial angle φ, for instance at about 90 degrees, between the first path 160a and the second path 160b. The optical beam steering component 140 may then be controlled to vary the angle between the first path 160a and the second path 160b, for instance to increase or decrease φ. Specifically, the optical beam steering component 140 may be controlled at fast tuning rates to vary the angle between the first path 160a and the second path 160b at corresponding rates. The optical beam steering component 140 and the laser path may be mounted on an optical platform, such as an optical table, and may be aligned manually using standard optical alignment procedures or advance optical alignment tools.

In an embodiment, the optical beam steering component 140 may be a mirror coupled to a tilt platform 142 or mounted on a rotary stage, which may redirect the light beam by reflecting the light beam from the first path 160a to the second path 160b. The minor may be coated with a high reflection coating, such as gold, silver, and/or aluminum layers, which is suitable for the range of wavelengths of the light beam. The tilt platform 142 may be coupled to a mechanical actuator, which may be controlled to rotate the mirror in a clockwise or counter-clockwise direction to increase or decrease the angle φ. In an embodiment, the tilt platform 142 may be a piezo-actuated tilt platform that provides fast rotation and fine angular resolution over a small range of angles, for instance at about few milliradians (mrad). In the case of compact piezo-actuated tilt platforms, fast rotation may be achieved by controlling the tilt platform using rates or frequencies of at least about one kHz, at least about five kHz, or at least about ten kHz. For instance, high speed piezo-actuated tilt platforms may have a mechanical resonance frequency at about 5.2 kHz or about 7.5 kHz. In other embodiments, mechanical actuators may be used to control the tilt platforms, for example at frequencies up to about ten kHz.

In another embodiment, the optical beam steering component 140 may be an electro-optic prism, which may redirect the light beam without a mechanical actuator by refracting the light beam and changing its direction from the first path 160a to the second path 160b. The electro-optic prism may be an electro-optic crystal that changes its index of refraction in the direction of propagation of the light beam depending on the amount of applied voltage across some axis of the crystal. Specifically, by varying the applied voltage across the electro-optic prism in a controlled manner, the index of refraction of the electro-optic prism may be changed in a corresponding manner, based on the electro-optic effect. As the index of refraction of the electro-optic prism changes, the angle of refraction in the electro-optic prism, and hence the angle φ between the first path 160a and the second path 160b, may be changed. The rate of change of the angle φ may be equal to about the rate of change of the applied voltage or the index of refraction, which may be faster than the control rate or the mechanical resonance frequency of the mechanical actuators.

The diffraction grating 150 may be any reflective grating, which may be configured to reflect at least a portion of the light beam at the second path 160b that is incident on the surface of the diffraction grating 150. The reflected light beam may comprise a higher order diffracted light beam, such as the first order diffracted light beam. The surface of the diffraction grating 150 may be ruled and comprise a plurality of grooves, which may be blazed to maximize the power of the reflected light beam at a desired wavelength or range of wavelengths. The profiles of the blazed grooves may be designed based on the Littrow condition, such that the incident light beam and the reflected portion of the light beam may be collimated, e.g., propagate at the same direction along the second path 160b. The diffraction grating 150 may also reflect a second portion of the incident light beam from the second path 160b to the unused path 170. The reflected light beam along the unused path 170 may comprise a zero order diffracted light beam. For example, the diffraction grating 150 may be a ruled diffraction grating blazed for high reflectance at wavelengths near to a center wavelength equal to about 5.4 μm and comprising about 150 grooves per mm on the surface. While the diffraction grating 150 may be configured with a course adjustment to rotate the diffraction grating 150 to an appropriate angle with respect to the optical beam steering component 140, the diffraction grating 150 may be relatively stationary during operation of the fast tunable mode-hop-free ECL 100. As such, the diffraction grating 150 may be uncoupled from the optical beam steering component 140 such that rotation of the optical beam steering component 140 does not affect the position or orientation of the diffraction grating 150.

The light leaving the diffraction grating 150 may return to the laser source 120 along its original path. Specifically, the light beam reflected back along the second path 160b between the diffraction grating 150 and the optical beam steering component 140 may be redirected by the optical beam steering component 140 to the first path 160a, and hence back to the laser source 120. The reflected light beam may pass through the first lens 130, which may cause the reflected light beam to converge and pass through the same side of the laser source 120, for instance via the same aperture or opening, as the initially emitted light beam. Further, at least some portion of the reflected light beam may pass through the other side of the laser source 120 along the output path 180. A second lens 130 may be aligned with the laser source 120 to collimate the light propagating from the other side of the laser source 120 into a parallel light beam.

The light beam along the second path 160b may be incident on the diffraction grating 150 at an incident angle, $\theta$, with respect to the normal axis on the surface of the diffraction grating 150. The light beam may be reflected back along the second path 160b at a wavelength corresponding to the incident angle. Hence, if the incident angle of the light beam on the surface of the diffraction grating 150 changes, the wavelength of the reflected light beam along the output path 180 may change accordingly. The incident angle $\theta$ and hence the wavelength of the reflected light beam may vary when the angle $\phi$ between the first path 160a and the second path 160b is varied, e.g., by steering or redirecting the light beam at the optical beam steering component, as described above. For instance, if the angle $\phi$ is increased by about $\Delta\phi$ in a counterclockwise direction, as shown in FIG. 1, the incident angle $\theta$ may increase by about $\Delta\theta$, which may also vary the wavelength of the reflected light beam.

Further, varying the angle $\phi$ between the first path 160a and the second path 160b may vary the length of the second path 160b between the optical beam steering component 140 and the diffraction grating 150. For instance, increasing the angle $\phi$ by about $\Delta\phi$ may increase the length of the second path 160b, L, by about $\Delta L$, as shown in the magnified image of the diffraction grating 150 in FIG. 1. The change in the length of the second path 160b, $\Delta L$, may be approximated assuming small changes in the angle $\phi$, or small $\Delta\phi$, with respect to the incident angle $\theta$, for instance in the case of a limited or narrow angular steering range for the optical beam steering component 140. The value of $\Delta L$ may be approximated based on $\Delta\phi$ and the displacement length of the incident light beam on the surface of the diffraction grating, $\Delta x$, due to the change in the angle $\phi$. For instance, $\Delta L$ may be approximated using the trigonometric relation $\Delta L = \Delta x \tan(\theta)$. Further, the value of $\Delta x$ may be calculated based on $\Delta\phi$ and the initial length of the second path 160b, or L, according to the trigonometric relation $\Delta x = L \tan(\Delta\phi)$. Consequently, the value of $\Delta L$ may be approximated using the relation $\Delta L = L \tan(\Delta\phi) \tan(\theta)$. It is clear according to this relation that changing the angle $\phi$ between the first path 160a and the second path 160b changes the length of the second path 160b. Since the first path 160a and the second path 160b determines an EC length in the Littrow arrangement of the fast tunable mode-hop-free ECL 100, varying the angle $\phi$ and hence L may vary an effective EC length of the fast tunable mode-hop-free ECL 100.

In addition to the incident angle $\theta$ on the surface of the grating 150, the EC length of the fast tunable mode-hop-free ECL 100 may determine the wavelength or the range of wavelengths of the reflected light beam along the output path 180. Since both the incident angle $\theta$ and the EC length may be controlled or changed by changing the angle $\phi$, the angle $\phi$ may also determine the wavelength or the range of wavelengths of the light beam at the output. Accordingly, careful consideration may be needed to choose the range of allowed steering angles $\phi$, the incident angle $\theta$, and the initial EC length corresponding to the angle $\phi$ before steering the light beam. Additionally, the design of the diffraction grating 150, including the number of grooves, the blazing angle, or other design aspects such as an appropriate ratio of the total EC length to the length of the second path 160b, may be chosen with care to extend the tunable wavelength range of the light beam. To a first approximation, the mode-hop-free tuning may be achieved if the grating is chosen such that the incident angle $\theta$ for the required laser operating wavelength may be in the range between about 45 degrees and about 90 degrees and the ratio of the total EC length to the length of the second path 160b may be equal to about $\{\tan(\theta)\}^2$.

In some embodiments, the diffraction grating 150 may be mounted on a rotary stage for coarse tuning, which may be done manually. As such, the diffraction grating 150 may be rotated at a substantially slower rate than the optical beam steering component 140 to extend the tunable range of the incident angle $\theta$, the EC length, or both, and hence the tunable wavelength range of the light beam at the output.

The direction of the reflected light beam along the unused path 170 may also vary based on the incident angle of the light beam on the surface of the diffraction grating 150. However, this reflected portion of the light beam may not be used since it may be difficult to couple the reflected light beam along the unused path 170 to a fixed output path. Instead, this reflected portion of the light beam may be blocked or prevented from propagating back towards the components of the fast tunable mode-hop-free ECL 100 to avoid unwanted light interference.

Figure 2:
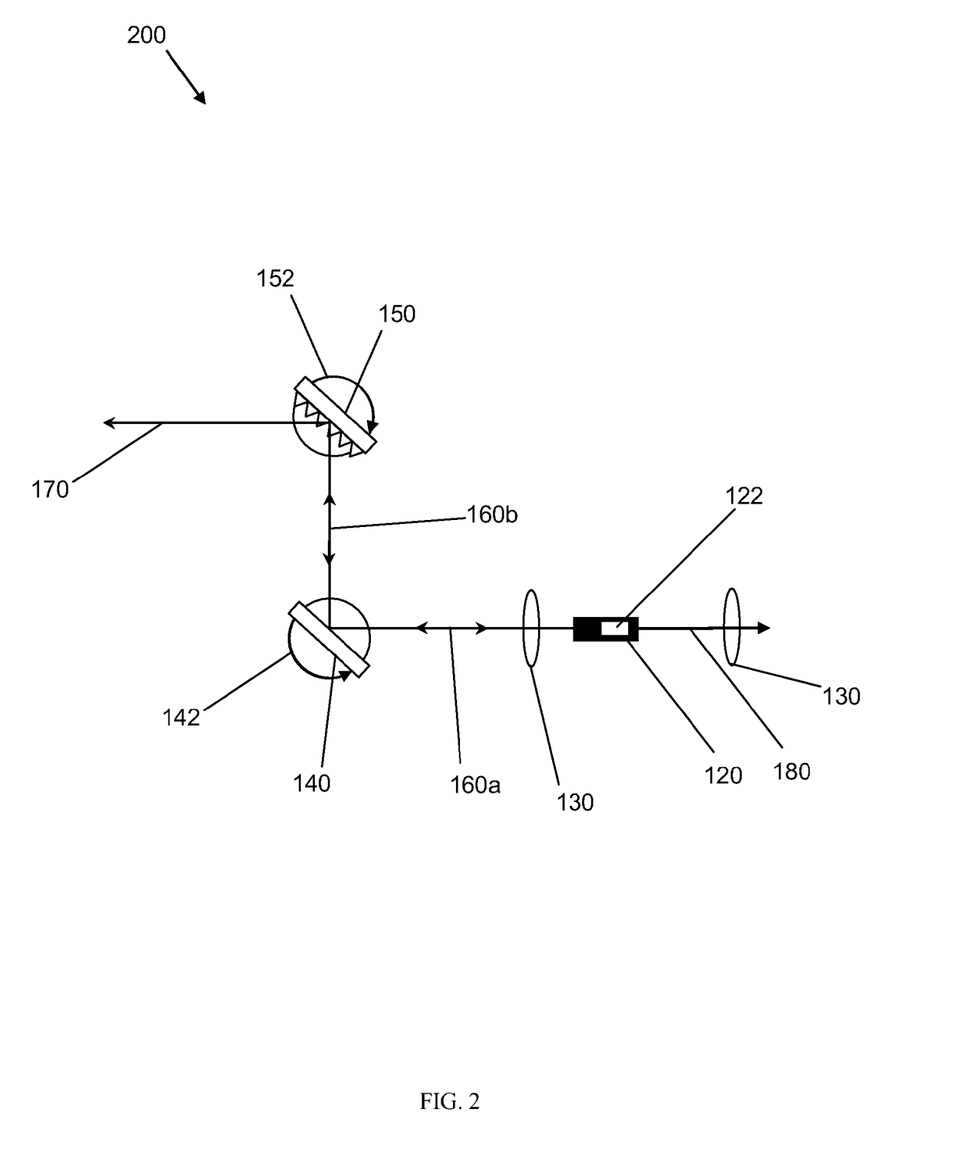
FIG. 2 is a schematic diagram of another embodiment of a fast tunable mode-hop-free ECL.

FIG. 2 illustrates another embodiment of a fast tunable mode-hop-free ECL 200, which may comprise dual mechanical actuators and a single folded Littrow cavity configuration. The fast tunable mode-hop-free ECL 200 may comprise the same components of the fast tunable mode-hop-free ECL 100, which may be configured and arranged in a substantially similar manner. However, the diffraction grating 150 may be configured to rotate in a controlled manner to change the incident angle $\theta$ between the light beam along the second path 160b and the normal axis on the surface of the diffraction grating 150. The diffraction grating 150 may be initially aligned with respect to the optical beam steering component 140 to redirect the light beam at an initial angle $\theta$, for instance at about 45 degrees, between the second path 160b and the normal axis on the surface of the diffraction grating 150. The diffraction grating 150 may then be controlled to vary the incident angle on the surface, for instance to increase or decrease $\theta$.

In an embodiment, the diffraction grating 150 may be controlled at high rates, which may be at least about one kHz, to vary the incident angle at high speeds corresponding to the high rates. For instance, the diffraction grating 150 may be coupled to a second tilt platform 152 or mounted on a rotary stage. The second tilt platform 152 may be coupled to a mechanical actuator, which may be controlled to rotate the diffraction grating 150 in a clockwise or counter-clockwise direction to increase or decrease the incident angle θ. In an embodiment, the second tilt platform 152 may be a piezo-actuated tilt platform that provides fast tuning at the aforementioned rates. The second tilt platform 152 of the diffraction grating 150 may be substantially similar to the tilt platform 142 or may be a different type of tilt platform. The diffraction grating 150 may be rotated in a synchronous manner with the optical beam steering component 140 using a control rate equal to about the control rate of the optical beam steering component 140. Alternatively, the diffraction grating 150 may be rotated independently from the optical beam steering component and at a different rate.

Rotating the diffraction grating 150 using the second tilt platform 152 may provide more automated wavelength tuning, increased wavelength tuning range, faster angular tuning speeds, or combinations thereof in comparison to a fixed or coarsely rotated diffraction grating, such as in the fast tunable mode-hop-free ECL 100. Further, varying the incident angle θ by rotating the diffraction grating 150 may provide more independent tuning between the steering angle φ and the incident angle θ. Since, changing the incident angle θ also changes the EC length, as shown in the trigonometric relations above, more independent EC length tuning may also be achieved. By achieving more independent tuning between the incident angle θ, the EC length, and the angle φ, the wavelength tuning capability may be improved. Additionally, direct tuning of the incident angle adds a degree of freedom to the design of the fast tunable mode-hop-free ECL 200, which may relax the design requirements for the diffraction grating 150 and allow using available diffraction gratings with different designs.

Figure 3:
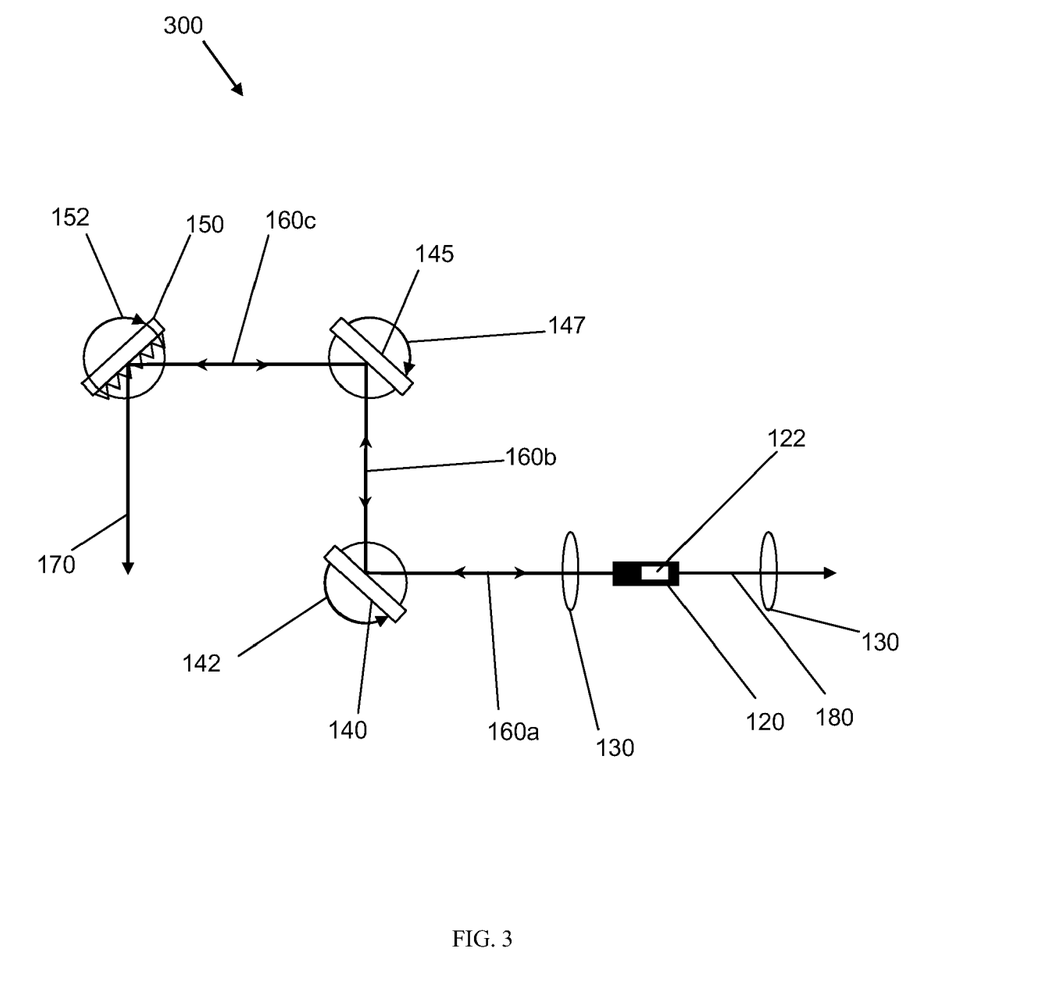
FIG. 3 is a schematic diagram of another embodiment of a fast tunable mode-hop-free ECL.

FIG. 3 illustrates another embodiment of a fast tunable mode-hop-free ECL 300, which may comprise dual mechanical actuators and a double folded Littrow cavity configuration. The fast tunable mode-hop-free ECL 300 may comprise the same components of the fast tunable mode-hop-free ECL 200, which may be configured and arranged in a substantially similar manner, including the diffraction grating 150 coupled to the second tilt platform 152. Additionally, the fast tunable mode-hop-free ECL 300 may comprise a second optical beam steering component 145.

The laser source 120, the optical beam steering component 140, the second optical beam steering component 145, and the diffraction grating 150 may be arranged in a double folded Littrow cavity configuration. Accordingly, the fast tunable mode-hop-free ECL 300 may comprise a first path 160a between the laser source 120 and the optical beam steering component 140, a second path 160b between the optical beam steering component 140 and the second optical beam steering component 145, and a third path 160c between the second optical beam steering component 145 and the diffraction grating 150. The light beam from the laser source 120 may propagate along the first path 160a, the second path 160b, and the third path 160c to the diffraction grating 150, and at least a portion of the reflected light beam may propagate back to the laser source 120 along the same paths.

The second optical beam steering component 145 may be configured to steer or redirect the light beam from the second path 160b to the third path 160c to change an angle between the second path 160b and the third path 160c in a substantially similar manner to the optical beam steering component 140. The second optical beam steering component 145 may be initially aligned with respect to the optical beam steering component 140 and the diffraction grating 150 to redirect the light beam at an initial angle, for instance at about 90 degrees, between the second path 160b and the third path 160c. The second optical beam steering component 145 may then be controlled to increase or decrease this angle.

In an embodiment, the second optical beam steering component 145 may be a mirror coupled to a third tilt platform 147 or mounted on a rotary stage. The third tilt platform 147, which may be a piezo-actuated tilt platform, may be coupled to a second mechanical actuator. The second mechanical actuator may be controlled to rotate the minor in a clockwise or counter-clockwise direction to increase or decrease the steering angle. Alternatively, the second optical beam steering component 145 may be an electro-optic prism. The third tilt platform 147 may be substantially similar to the first tilt platform 142, the second tilt platform 152, or both or may be a different type of tilt platform. The second optical beam steering component 145 may be rotated in a synchronous manner with the optical beam steering component 140, the diffraction grating 150, or both at about equal rates. Alternatively, the second optical beam steering component 147 may be rotated independently from the optical beam steering component 140 and the diffraction grating 150.

Using the second optical beam steering component 145 to steer the light beam at an additional path between the laser source 120 and the diffraction grating 150 may further improve the automated wavelength tuning process, increase the wavelength tuning range, increase the angular tuning speed, or combinations thereof in comparison to the previous two system designs. Additionally, by introducing a second variable tuning angle between the second path 160b and the third path 160c, more independent tuning may be achieved and some design limitations of the previous two systems may be eliminated. For instance, unlike the fast tunable mode-hop-free ECL 200, using the dual mechanical actuators may reduce the strict alignment requirements of the diffraction grating 150 on the second tilt platform 152. In other embodiments for fast tunable mode-hop-free ECLs, more than two optical steering components may be used in addition to rotating the diffraction grating to improve the tuning capability of the system. However, increasing the number of these components may increase cost and may have other practical limitations.

In the systems and designs presented above, mode-hop-free fast wavelength tuning may be achieved without using translation for any of the system components to tune the wavelength of the light beam during operation. Hence, the systems described herein may not have the tuning speed limitations such as current systems, where mechanical translation may be used with rotation to tune the EC length and the incident angle on the diffraction grating at rates equal to about 100 Hertz. Instead, the EC length may be tuned at substantially faster rates by tuning at least one steering angle and the incident angle.

The systems described above may be used to develop widely tunable high resolution spectrometers for various molecular spectroscopic applications, such as the detection of chemical trace gas species or concentration measurements of small molecules at reduced pressures. The systems herein may also be used in other spectral measurement applications, including the UV, the visible, and the terahertz regions. Further, the systems herein may be used as tunable frequency standards for heterodyne applications or as widely tunable light sources for free-space optical data transmission.

EXAMPLES

A plurality of test systems or prototypes have been considered to further explore the concepts described herein. In a first example, a test system similar to that illustrated and described in conjunction with FIG. 1 is investigated. The test system may comprise a motorized and/or manual coarse angle control for the grating angle. The mechanical actuator used to rotate a mirror in the system is a PSH 411 tilting system from Piezo Jena that allows precise tilt angles with a resolution ranging of about $0.4 \times 10^{-3}$ microradians (μrad). The total wavelength tuning range depends on the laser source wavelengths, the diffraction grating parameters, and the applied configuration. Hence, the dimensions of the system are calculated for a given set of parameters. For instance, the system has a wavelength, h, equal to about 5 μm (or 2,000 cm$^{-1}$) and a diffraction grating comprising about 150 lines/mm. The diffraction grating is aligned in a Littrow configuration at an initial incident angle equal to about 22 degrees with respect to the incident light beam before beam steering. The distance between the tilt mirror and the diffraction grating is equal to about 25 mm. The minor is mounted on a PZT tilt platform that provides about four mrad maximum tilt angle. The change in the optical path of the EC length is equal to about −80 μm. For about a five centimeter (cm) long EC length, this type of wavelength tuning may result in about 3.2 cm$^{-1}$ mode-hop-free laser frequency tuning range at rates of about −0.8f$_r$ or about 5.2 kHz, where f$_r$ is the actuator resonance frequency.

In another example, a second test system similar to that illustrated and described in conjunction with FIG. 2 is examined. The system comprises at least two high-speed miniature piezo tilt platforms from Physik Instrumente, labeled as S-224.00. The piezo tilt platforms have a maximum tilt angle of about 2.2 mrad (or about 0.126 degrees) and a mechanical resonance frequency equal to about 7.5 kHz. The system may comprise a QCL gain chip, a collimating lens, a steering mirror, and a diffraction grating. The steering mirror and diffraction grating are mounted on the two tilt platforms and are controlled to provide synchronized tuning of the EC length and the incident angle. Similar to the first test system, the second system has a wavelength, h, equal to about 5 μm (or 2,000 cm$^{-1}$) and a diffraction grating comprising about 150 lines/mm. The diffraction grating is also aligned in a Littrow configuration at an initial incident angle equal to about 22 degrees with respect to the incident beam before beam steering. Accordingly, the S-224.00 PZT tilt platforms have a maximum change of about −44 μm in the length of the optical path of the beam. For about a five cm long EC, such tuning range allows about 0.8 cm$^{-1}$ mode hop-free laser wavelength tuning range at rates equal to about 0.8f$_r$ or about six kHz. An alternative design can also be implemented using PSH 35 piezo activated tilt stages. In this case, an approximate change in optical path of about 350 μm can be achieved at a maximum rate of about one kHz.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. An apparatus comprising:
   a laser source configured to emit a light beam along a first path;
   a first optical beam steering component configured to steer the light beam from the first path to a second path at a first angle to the first path;
   a second optical beam steering component located between the first optical beam steering component and the diffraction grating and configured to redirect the light beam to a third path at a second angle to the second path; and a diffraction grating configured to reflect back at least a portion of the light beam along the second path and the third path, wherein the first optical beam steering component is configured to change the angle at a first rate;

wherein the second optical beam steering component is configured to change the second angle at a second rate;

wherein the first angled and the second angle determine an external cavity (EC) length; and wherein none of the laser source, the optical beam steering component, and the diffraction grating are linearly translated to vary the external cavity (EC) length.

2. The apparatus of claim 1, wherein the portion of the light beam is reflected back along the third path, second path and the first path to an output at the laser source at a wavelength corresponding to an incident angle to the third path on the surface of the diffraction grating.

3. The apparatus of claim 1, wherein a change in the first and/or second angle varies an incident angle of the third path on the surface of the diffraction grating and the EC length.

4. The apparatus of claim 1, wherein a change in the first and/or second angle promotes laser output emissions without substantial discontinuities in the range of wavelengths.

5. The apparatus of claim 1, wherein a change in the first and/or second angle promotes laser output emissions at about equal power levels.

6. The apparatus of claim 1, wherein the first and/or second optical beam steering component is an electro-optical prism.

7. The apparatus of claim 1, wherein the first and/or second optical beam steering component is configured to change the first and/or second angle at a steering rate that is greater than or equal to about one Kilohertz (kHz).

8. The apparatus of claim 1, wherein the light beam comprises a plurality of wavelengths between about three micrometers ($\mu m$) to about 30 $\mu m$.

9. The apparatus of claim 1, wherein the laser source does not comprise an antireflection coating.

10. The apparatus of claim 1, wherein the laser source is a Quantum Cascade (QC) laser or an Interband Cascade (IC) laser.

11. The apparatus of claim 1, wherein the first and/or second optical beam steering component is a mirror coupled to a rotary stage, and wherein the rotary stage is a high speed piezo-actuated tilt platform.

12. The apparatus of claim 11, wherein the high-speed piezo-actuated tilt platform has a mechanical resonance frequency of about 5.2 kHz or about 7.5 kHz.

13. The apparatus of claim 1, wherein the orientation of the diffraction grating is fixed or the diffraction grating is configured to be rotated at substantially lower rates than the first and/or second optical beam steering component.

14. The apparatus of claim 1, wherein the diffraction grating and the first and/or second optical beam steering component are rotated at about equal rates in a synchronous manner.

15. The apparatus of claim 1, wherein the first rate and the second rate are about equal.

16. The apparatus of claim 1, wherein the diffraction grating is coupled to a rotary stage that is rotated at a rate equal to about the first rate, about the second rate, or both in a synchronous manner.

* * * * *

UNITED STATES PATENT AND TRADEMARK OFFICE
CERTIFICATE OF CORRECTION

| | | |
|---|---|---|
| PATENT NO. | : 7,869,474 B2 | Page 1 of 1 |
| APPLICATION NO. | : 12/349839 | |
| DATED | : January 11, 2011 | |
| INVENTOR(S) | : Gerard Wysocki et al. | |

It is certified that error appears in the above-identified patent and that said Letters Patent is hereby corrected as shown below:

Column 1, line 19, replace "Aerodyne Research Inc." with --Aerodyne Research, Inc.--.

Claim 1, column 13, line 8, replace "first angled" with --first angle--.

Signed and Sealed this
Fifteenth Day of March, 2011

David J. Kappos
*Director of the United States Patent and Trademark Office*